United States Patent
Saule et al.

(10) Patent No.: US 12,045,539 B2
(45) Date of Patent: Jul. 23, 2024

(54) METHODS AND DEVICES FOR CONTROLLING AUDIO PARAMETERS

(71) Applicants: DOLBY LABORATORIES LICENSING CORPORATION, San Francisco, CA (US); DOLBY INTERNATIONAL AB, Amsterdam Zuidoost (NL)

(72) Inventors: Lucas E. Saule, San Francisco, CA (US); Eugene Chen, Alameda, CA (US); Julien Guy Pierre Derreveaux, La Canyada (ES); Jakub Siwak, Wroclaw (PL); Daniel Christian Brinkley, San Francisco, CA (US)

(73) Assignees: DOLBY LABORATORIES LICENSING CORPORATION, San Francisco, CA (US); DOLBY INTERNATIONAL AB, Dublin (IE)

( * ) Notice: Subject to any disclaimer, the term of this patent is extended or adjusted under 35 U.S.C. 154(b) by 0 days.

(21) Appl. No.: 17/278,081

(22) PCT Filed: Sep. 18, 2019

(86) PCT No.: PCT/US2019/051762
§ 371 (c)(1),
(2) Date: Mar. 19, 2021

(87) PCT Pub. No.: WO2020/061215
PCT Pub. Date: Mar. 26, 2020

(65) Prior Publication Data
US 2022/0129235 A1 Apr. 28, 2022

Related U.S. Application Data

(60) Provisional application No. 62/863,509, filed on Jun. 19, 2019, provisional application No. 62/733,469, filed on Sep. 19, 2018.

(51) Int. Cl.
*G06F 3/16* (2006.01)
*G06F 3/041* (2006.01)
(Continued)

(52) U.S. Cl.
CPC ........... *G06F 3/165* (2013.01); *H04R 1/1041* (2013.01); *G06F 3/041* (2013.01);
(Continued)

(58) Field of Classification Search
CPC ...... G06F 3/041; G06F 3/04847; G06F 3/167; G06F 3/0488; G06F 3/165; G10L 21/0208; H03G 3/342; H03G 3/20
See application file for complete search history.

(56) References Cited

U.S. PATENT DOCUMENTS

| 803,870 A | 11/1905 | Briggs | |
| 11,153,687 B1 * | 10/2021 | Graham | H04R 5/033 |

(Continued)

FOREIGN PATENT DOCUMENTS

| JP | 2011022961 A | 2/2011 |
| JP | 2012053876 | 3/2012 |

(Continued)

*Primary Examiner* — Carolyn R Edwards
*Assistant Examiner* — Kuassi A Ganmavo

(57) ABSTRACT

A method of controlling headphones having external microphone signal pass-through functionality may involve controlling a display to present a geometric shape on the display and receiving an indication of digit motion from a sensor system associated with the display. The sensor system may include a touch sensor system or a gesture sensor system. The indication may be an indication of a direction of digit motion relative to the display. The method may involve controlling the display to present a sequence of images indicating that the geometric shape either enlarges or contracts, depending on the direction of digit motion and changing a headphone transparency setting according to a (Continued)

current size of the geometric shape. The headphone transparency setting may correspond to an external microphone signal gain setting and/or a media signal gain setting of the headphones.

12 Claims, 11 Drawing Sheets

(51) Int. Cl.
*G06F 3/04847* (2022.01)
*G06F 3/0488* (2022.01)
*G10L 21/0208* (2013.01)
*H03G 3/20* (2006.01)
*H03G 3/34* (2006.01)
*H04R 1/10* (2006.01)

(52) U.S. Cl.
CPC ........ *G06F 3/04847* (2013.01); *G06F 3/0488* (2013.01); *G10L 21/0208* (2013.01); *H03G 3/20* (2013.01); *H03G 3/342* (2013.01)

(56) References Cited

U.S. PATENT DOCUMENTS

| | | | | |
|---|---|---|---|---|
| 2008/0297483 | A1* | 12/2008 | Kim | G06F 3/04847 345/173 |
| 2013/0303096 | A1* | 11/2013 | Foster | H04R 1/1091 455/149 |
| 2014/0036127 | A1* | 2/2014 | Pong | H04R 1/1058 348/333.01 |
| 2014/0071171 | A1* | 3/2014 | McGowan | G06F 3/04883 345/173 |
| 2014/0089867 | A1* | 3/2014 | Jang | G06F 3/04883 715/863 |
| 2014/0223298 | A1* | 8/2014 | Kim | G06F 3/04847 715/708 |
| 2015/0106711 | A1* | 4/2015 | Virolainen | H03G 5/005 715/716 |
| 2015/0169280 | A1* | 6/2015 | Suzuki | G06F 3/04847 715/716 |
| 2015/0243272 | A1 | 8/2015 | Ozluturk | |
| 2015/0280669 | A1* | 10/2015 | Vilermo | G10K 11/17885 381/107 |
| 2016/0119709 | A1* | 4/2016 | Beurton | G06F 3/165 381/74 |
| 2016/0210105 | A1* | 7/2016 | Ru | H04L 65/65 |
| 2018/0182371 | A1 | 6/2018 | Thormundsson | |
| 2018/0301135 | A1 | 10/2018 | Yamabe | |
| 2018/0349087 | A1* | 12/2018 | Park | G06F 3/017 |
| 2018/0364901 | A1* | 12/2018 | Fan | G06F 3/0482 |
| 2019/0069069 | A1* | 2/2019 | Radin | H03G 3/342 |
| 2019/0179604 | A1 | 6/2019 | Alexander | |
| 2019/0313179 | A1 | 10/2019 | Saule | |

FOREIGN PATENT DOCUMENTS

| | | | |
|---|---|---|---|
| JP | 2013156958 A | 8/2013 | |
| JP | 2013222277 A | 10/2013 | |
| JP | 2014050072 | 3/2014 | |
| JP | 2015173369 | 10/2015 | |
| JP | 2015184786 A | 10/2015 | |
| JP | 2017152873 A | 8/2017 | |
| JP | 2018507661 | 3/2018 | |
| WO | 2012160415 A1 | 11/2012 | |
| WO | WO-2012160415 A1 * | 11/2012 | ......... G06F 3/04847 |
| WO | 20170064929 | 4/2017 | |
| WO | 2017217621 | 12/2017 | |

* cited by examiner

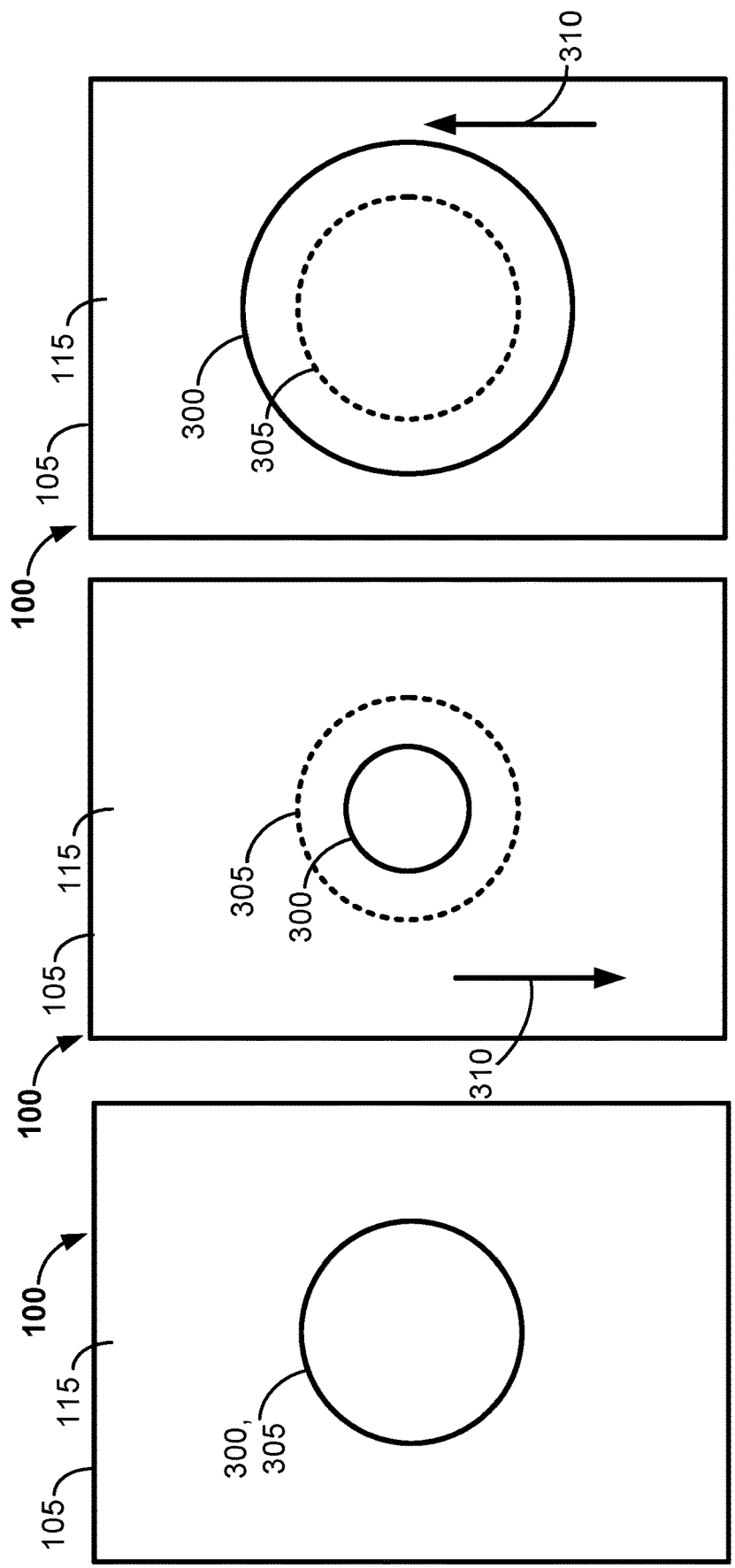

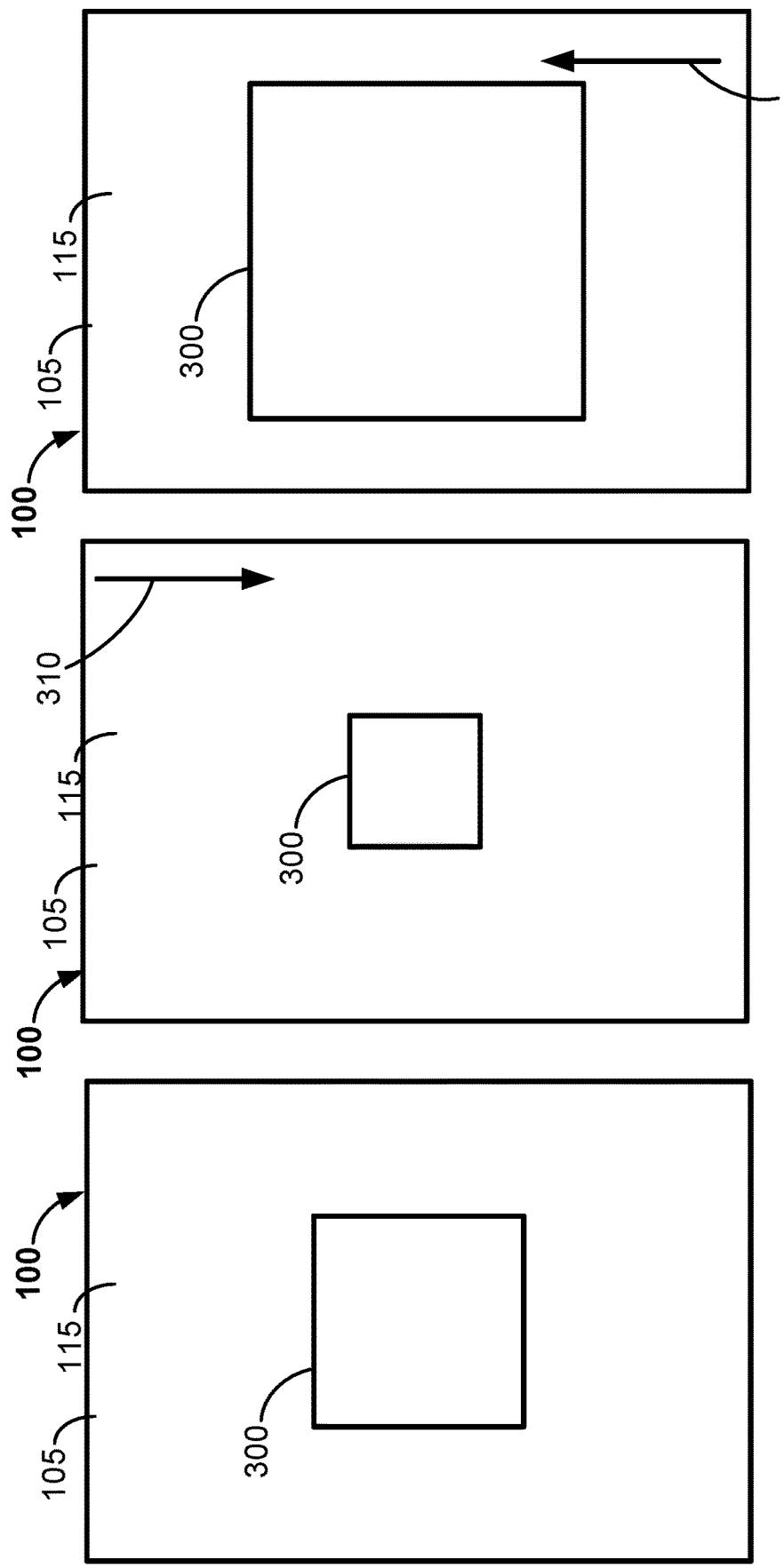

METHODS AND DEVICES FOR CONTROLLING AUDIO PARAMETERS

CROSS-REFERENCE TO RELATED APPLICATIONS

This application claims priority to United States Provisional Patent Application No. 62/733,469, filed Sep. 19, 2018 and U.S. Provisional Patent Application No. 62/863,509, filed Jun. 19, 2019, which is hereby incorporated by reference in its entirety.

TECHNICAL FIELD

This disclosure relates to controlling audio parameters.

BACKGROUND

The use of audio devices such as headphones and earbuds has become extremely common. Such audio devices can at least partially occlude sounds from the outside world. Some headphones are capable of creating a substantially closed system between headphone speakers and the eardrum, in which sounds from the outside world are greatly attenuated. There are various potential advantages of attenuating sounds from the outside world via headphones or other such audio devices, such as eliminating distortion of media signals being reproduced by headphones, providing a flat equalization, etc. However, when wearing such audio devices a user may not be able to hear sounds from the outside world that it would be advantageous to hear, such as the sound of an approaching car, the sound of a friend's voice, etc.

SUMMARY

As used herein, the term "headphone" or "headphones" refers to an ear device having at least one speaker configured to be positioned near the ear, the speaker being mounted on a physical form (referred to herein as a "headphone unit") that at least partially blocks the acoustic path from sounds occurring around the user wearing the headphones. Some headphone units may be earcups that are configured to significantly attenuate sound from the outside world. Such sounds may be referred to herein as "environmental" sounds. A "headphone" as used herein may or may not include a headband or other physical connection between the headphone units.

Some headphones may include at least one headphone microphone on the exterior of the headphone. Such headphone microphones also may be referred to herein as "environmental" microphones because the signals from such microphones can provide environmental sounds to a user even if the headphone units significantly attenuate environmental sound when worn. Such headphones have what will be referred to herein as "external microphone signal pass-through functionality." Some headphones having external microphone signal pass-through functionality may be configured to process both the microphone and media signals such that when mixed, the environmental microphone signal is audible above the media signal.

Determining appropriate gains for the environmental microphone signals and the media signals of headphones having external microphone signal pass-through functionality can be challenging. Some disclosed implementations provide methods for controlling audio parameters for such headphones. Some such methods may involve controlling a display to present a geometric shape on the display and receiving an indication of digit motion from a sensor system associated with the display. The display may, for example, be a display of a mobile display device, such as a cellular telephone. The sensor system may include a touch sensor system and/or a gesture sensor system. The indication of digit motion may be an indication of a direction of digit motion relative to the display. The method may involve controlling the display to present a sequence of images indicating that the geometric shape either enlarges or contracts, depending on the direction of digit motion. The method may involve changing a headphone transparency setting according to a current size of the geometric shape. The headphone transparency setting may correspond to an external microphone signal gain setting and/or a media signal gain setting of the headphones. In some instances, the current size of a geometric shape may correspond to an automatic noise cancellation (ANC) setting. According to some examples, the geometric shape may be a circle that enlarges when the direction of digit motion is towards an upper portion of the display.

Some disclosed implementations provide similar methods for controlling an audio recording process. Some such methods involve changing an intensity setting of an equalization curve for the audio recording process in accordance with a current size of the geometric shape. The equalization curve may, for example, be a selectable pre-set equalization curve.

Such implementations have various potential advantages. Some such implementations provide a graphical user interface (GUI) that is easy to use, even for a user lacking a deep knowledge of audio engineering principles. For example, a user does not need to know a particular external microphone signal gain setting, the particular media signal gain setting or the particular ANC setting corresponding to a size of the geometric shape, but can simply control the GUI to obtain a desired combination of these settings. Similarly, a user does not need to know the particular intensity setting of an equalization curve for an audio recording process that corresponds to a geometric shape's size. Instead, the user can simply control the GUI to obtain a desired intensity setting.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIGS. 3A-3C show some examples of geometric shapes that may be displayed when performing the method of FIG. 2.

FIGS. 3D-3F show some alternative examples of geometric shapes that may be displayed when performing the method of FIG. 2.

Like reference numbers and designations in the various drawings indicate like elements.

DESCRIPTION OF EXAMPLE EMBODIMENTS

Figure 1:
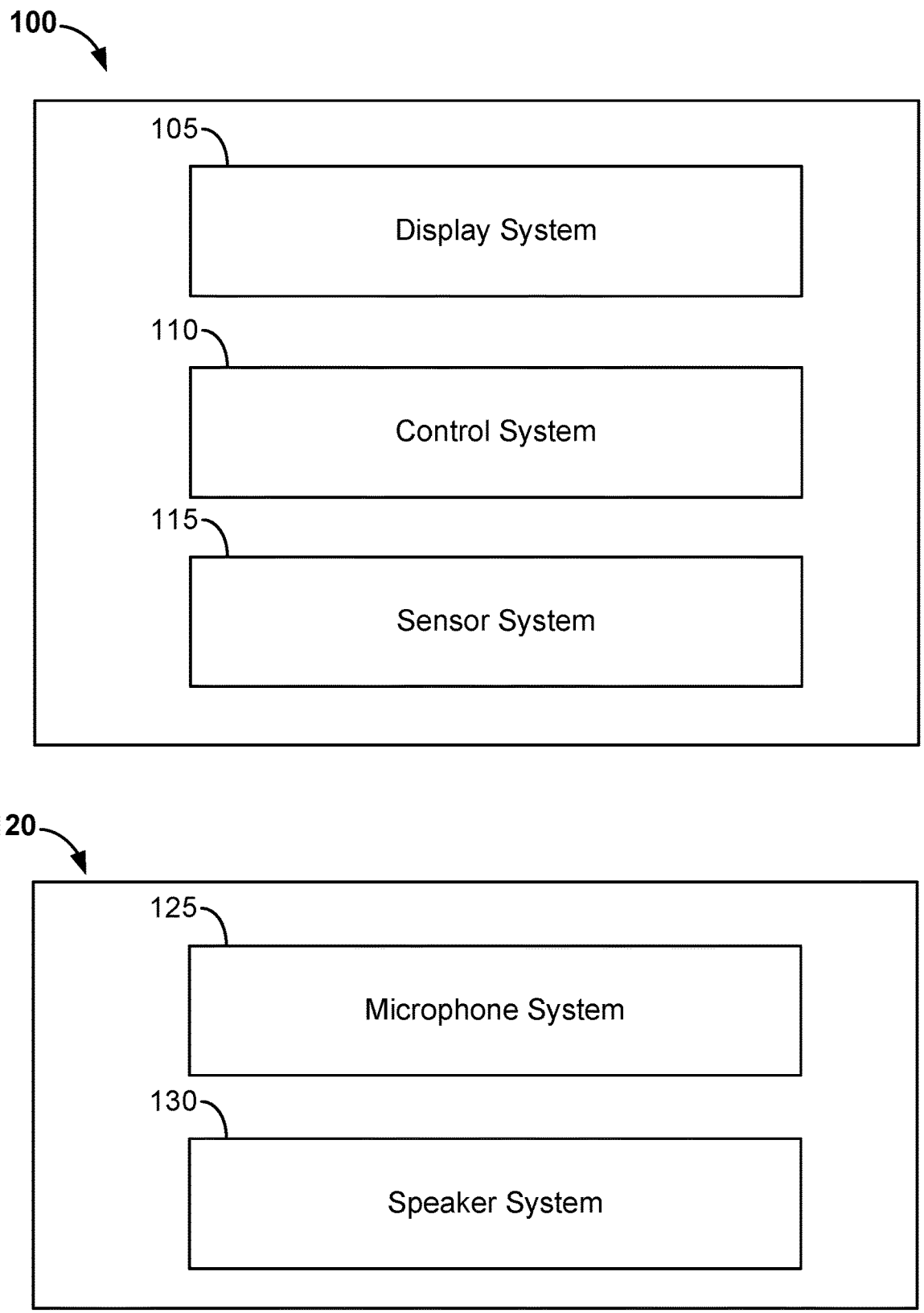
FIG. 1 is a block diagram that shows examples of components of an apparatus capable of implementing various aspects of this disclosure.

The following description is directed to certain implementations for the purposes of describing some innovative aspects of this disclosure, as well as examples of contexts in which these innovative aspects may be implemented. However, the teachings herein can be applied in various different ways. For example, while various implementations are described in terms of particular applications and environments, the teachings herein are widely applicable to other known applications and environments. Moreover, the described implementations may be implemented, at least in part, in various devices and systems as hardware, software, firmware, cloud-based systems, etc. Accordingly, the teachings of this disclosure are not intended to be limited to the implementations shown in the figures and/or described herein, but instead have wide applicability.

As noted above, audio devices that provide at least some degree of sound occlusion provide various potential benefits, such as an improved ability to control audio quality. Other benefits include attenuation of potentially annoying or distracting sounds from the outside world. However, a user of such audio devices may not be able to hear sounds from the outside world that it would be advantageous to hear, such as the sound of an approaching car, a car horn, a public announcement, etc.

Accordingly, one or more types of sound occlusion management would be desirable. Various implementations described herein involve sound occlusion management during times that a user is listening to a media stream of audio data via headphones, earbuds, or another such audio device. As used herein, the terms "media stream," "media signal" and "media input audio data" may be used to refer to audio data corresponding to music, a podcast, a movie soundtrack, etc., as well as the audio data corresponding to sounds received for playback as part of a telephone conversation. In some implementations, such as earbud implementations, the user may be able to hear a significant amount of sound from the outside world even while listening to audio data corresponding to a media stream. However, some audio devices (such as headphones) can significantly attenuate sound from the outside world. Accordingly, some implementations may also involve providing microphone data to a user. The microphone data may provide sounds from the outside world.

When a microphone signal corresponding to sound external to an audio device, such as a headphone, is mixed with the media signal and played back through speakers of the headphone, the media signal often masks the microphone signal, making the external sound inaudible or unintelligible to the listener. As such, it is desirable to process both the microphone and media signal such that when mixed, the microphone signal is audible above the media signal, and both the processed microphone and media signal remain perceptually natural-sounding. In order to achieve this effect, it is useful to consider a model of perceptual loudness and partial loudness, such as disclosed in International Publication No. WO 2017/217621, entitled "Media-Compensated Pass-Through and Mode-Switching," which is hereby incorporated by reference.

Some methods may involve determining a first level of at least one of a plurality of frequency bands of the media input audio data and determining a second level of at least one of a plurality of frequency bands of the microphone input audio data. Some such methods may involve producing media output audio data and microphone output audio data by adjusting levels of one or more of the first and second plurality of frequency bands. For example, some methods may involve adjusting levels such that a first difference between a perceived loudness of the microphone input audio data and a perceived loudness of the microphone output audio data in the presence of the media output audio data is less than a second difference between the perceived loudness of the microphone input audio data and a perceived loudness of the microphone input audio data in the presence of the media input audio data. Some such methods may involve mixing the media output audio data and the microphone output audio data to produce mixed audio data. Some such examples may involve providing the mixed audio data to speakers of an audio device, such as a headset or earbuds.

In some implementations, the adjusting may involve only boosting the levels of one or more of the plurality of frequency bands of the microphone input audio data. However, in some examples the adjusting may involve both boosting the levels of one or more of the plurality of frequency bands of the microphone input audio data and attenuating the levels of one or more of the plurality of frequency bands of the media input audio data. The perceived loudness of the microphone output audio data in the presence of the media output audio data may, in some examples, be substantially equal to the perceived loudness of the microphone input audio data. According to some examples, the total loudness of the media and microphone output audio data may be in a range between the total loudness of the media and microphone input audio data and the total loudness of the media and microphone output audio data. However, in some instances, the total loudness of the media and microphone output audio data may be substantially equal to the total loudness of the media and microphone input audio data, or may be substantially equal to the total loudness of the media and microphone output audio data.

Some implementations may involve receiving (or determining) a mode-switching indication and modifying one or more process based, at least in part, on the mode-switching indication. For example, some implementations may involve modifying at least one of the receiving, determining, producing or mixing process based, at least in part, on the mode-switching indication. In some instances, the modifying may involve increasing a relative loudness of the microphone output audio data, relative to a loudness of the media output audio data. According to some such examples, increasing the relative loudness of the microphone output audio data may involve suppressing the media input audio data or pausing the media stream. Some such implementations provide one or more types of pass-through mode. In a pass-through mode, a media signal may be reduced in volume, and the conversation between the user and other people (or other external sounds of interest to the user, as indicated by the microphone signal) may be mixed into the audio signal provided to a user. In some examples, the media signal may be temporarily silenced.

The above-described methods, along with the other related methods disclosed in International Publication No. WO 2017/217621, may be referred to herein as MCP (media-compensated pass-through) methods. However, the headphone-related methods disclosed herein are not limited to controlling MCP headphones, but are generally applicable to headphones having some type of external microphone signal pass-through functionality.

FIG. 1 is a block diagram that shows examples of components of an apparatus capable of implementing various aspects of this disclosure. In some implementations, the apparatus 100 may be, or may include, a mobile display device, such as a cellular telephone. In this example, the apparatus 100 includes a display system 105, a control system 110 and a sensor system 115. The display system may include one or more displays, such as a light-emitting diode (LED) display, an organic light-emitting diode (OLED) display, a liquid crystal display, a microLED display, etc.

The control system 110 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components. In some implementations, the control system 110 may be capable of performing, at least in part, the methods disclosed herein.

In this example, the apparatus 100 includes a sensor system 115 having one or more sensors. According to this implementation, the sensor system 115 includes a touch sensor system and/or a gesture sensor system associated with at least one display of the display system 105. For example, the sensor system 115 may include a touch sensor system and/or a gesture sensor system that overlays or underlies at least a portion of one display of the display system 105. The sensor system 115 may, in some examples, include one or more force sensors, pressure sensors, accelerometers and/or gyroscopes.

The ear device 120 may be, or may include, one or more headphones, ear buds, etc. In this example, the ear device 120 includes a microphone system 120. The microphone system 125, in this example, includes one or more microphones that reside on, or proximate to, an exterior portion of the ear device 120, such as on the exterior portion of one or more headphone units.

According to this implementation, the ear device 120 includes a speaker system 130 having one or more speakers. In some examples, at least a portion of the speaker system 130 may reside in or on a pair of headphone units.

Although not shown in FIG. 1, the apparatus 100 and the ear device 120 each may include an interface system. For example, the interface system(s) may include one or more wireless interfaces and/or one or more external device interfaces (such as one or more universal serial bus (USB) interfaces) that allow communication between the apparatus 100 and the ear device 120. In some implementations, the interface system(s) may include one or more network interfaces and/or one or more user interfaces in addition to the sensor system 115.

In some implementations the interface system(s) may include at least one user interface system. The user interface system may be configured for receiving input from a user. In some examples, the user interface system may incorporate at least a portion of the sensor system 105. For example, the user interface system may include one or more touch and/or gesture detection sensor systems, one or more inertial sensor devices, etc. In some implementations, the user interface system may be configured for providing feedback to a user. According to some examples, the user interface system may include apparatus for providing haptic feedback, such as a motor, a vibrator, etc.

In some examples, the interface system(s) may include one or more interfaces between the control system 110 and a memory system (not shown in FIG. 1). However, the control system 110 may include a memory system.

Some or all of the methods described herein may be performed by one or more devices according to instructions (e.g., software) stored on one or more non-transitory media, which may be a part of a memory system such as those referenced above. Such non-transitory media may include memory devices such as those described herein, including but not limited to random access memory (RAM) devices, read-only memory (ROM) devices, etc. Accordingly, various innovative aspects of the subject matter described in this disclosure can be implemented in one or more non-transitory media having software stored thereon. The software may, for example, include instructions for controlling at least one device to perform the methods disclosed herein. The software may, for example, be executable by one or more components of a control system such as the control system 110 of FIG. 1.

In some implementations at least part of the control system 110 may reside in different devices. For example, at least a portion of the control system 110 may reside in a device that is configured for communication with the apparatus 100, such as the ear device 120, a server, a component of an audio recording system, a component of a home entertainment system, etc.

Figure 2:
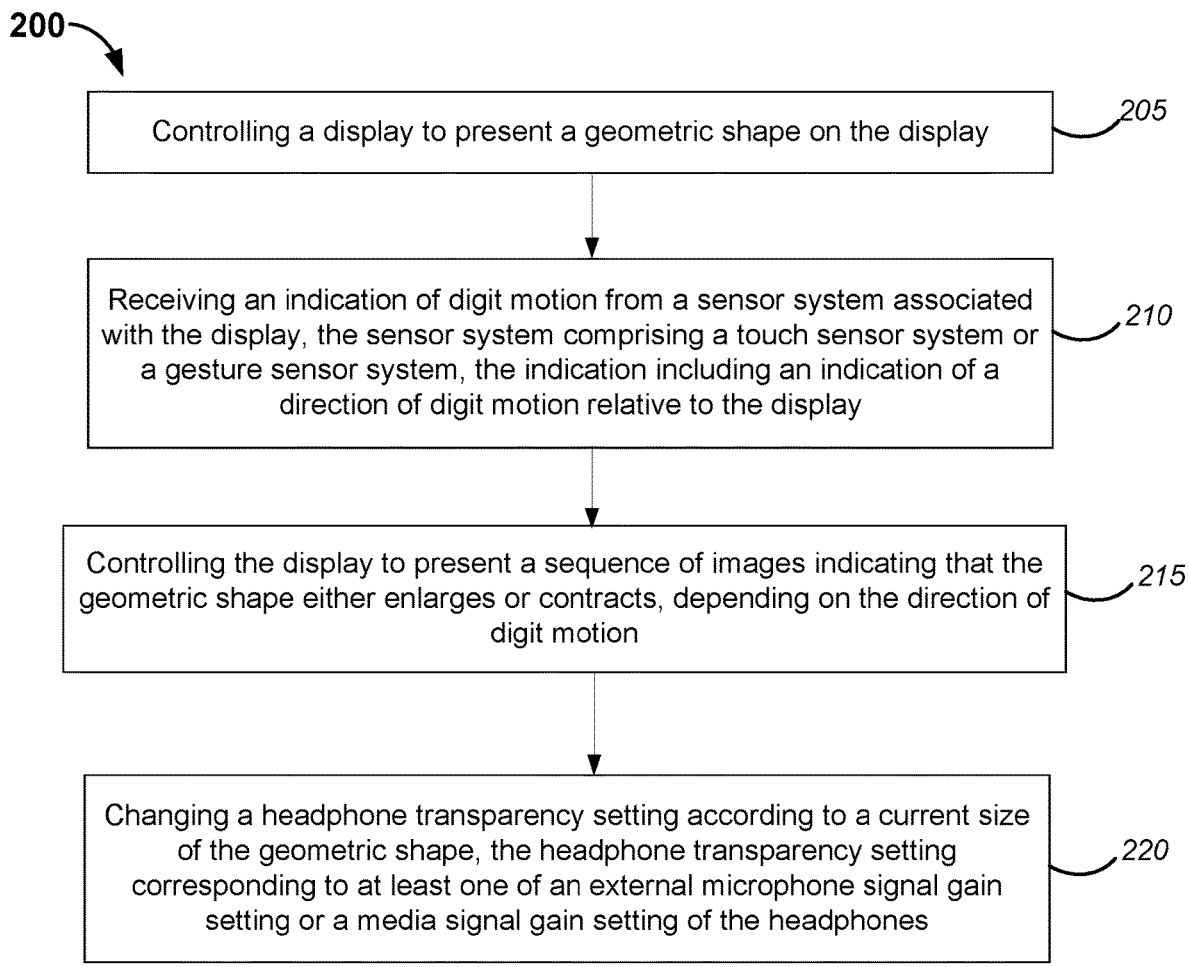
FIG. 2 is a flow diagram that outlines one example of a method that may be performed by an apparatus such as that shown in FIG. 1.

FIG. 2 is a flow diagram that outlines one example of a method that may be performed by an apparatus such as that shown in FIG. 1. The blocks of method 200, like other methods described herein, are not necessarily performed in the order indicated. Moreover, such methods may include more or fewer blocks than shown and/or described.

In this example, method 200 involves controlling settings for headphones having external microphone signal pass-through functionality. According to this implementation, block 205 involves controlling a display to present a geometric shape on the display. Block 205 may, for example, involve the control system 110 of FIG. 1 controlling a display of the display system 105.

According to this example, block 210 involves receiving an indication of digit motion from a sensor system associated with the display. Block 210 may involve the control system 110 of FIG. 1 receiving the indication from a touch sensor system or a gesture sensor system of the sensor system 105. In this example, the indication includes an indication of a direction of digit motion relative to the display. For example, the indication may include an indication of an upward, downward, left, right, diagonal, etc., direction of digit motion relative to the display.

In this implementation, block 215 involves controlling the display to present a sequence of images indicating that the geometric shape either enlarges or contracts, depending on the direction of digit motion. The sequence of images may include 2 or more images of the geometric shape. In some such examples, block 215 may involve indicating that the geometric shape enlarges in response to a predetermined direction of digit motion, such as an upwards digit motion.

According to this example, block 220 involves changing a headphone transparency setting according to a current size of the geometric shape. In this example, the headphone transparency setting corresponds an external microphone signal gain setting and/or a media signal gain setting of the headphones. In some examples, the headphone transparency setting may correspond to both an external microphone signal gain setting and a media signal gain setting. In some implementations, block 220 involves making a smooth transition between a first headphone transparency setting and a second headphone transparency setting. The smooth transition may, for example, involve changing an external microphone signal gain setting and/or a media signal gain setting of the headphones from the first headphone transparency setting to the second headphone transparency setting over a predetermined time interval. Alternatively, or additionally, the current size of the geometric shape may correspond to an automatic noise cancellation setting.

According to some examples, the method 200 may involve providing some type of haptic feedback. In some such examples, the apparatus 100 and/or the ear device 120 may include apparatus for providing haptic feedback, such as one or more motors, vibrators, etc. In some instances, the method 200 may involve providing haptic feedback when a user-selected setting (e.g., a setting that corresponds with a current size of the geometric shape 300, in response to a detected motion of the user's digit on a display of the apparatus 100) corresponds with a default setting, a minimum setting and/or a maximum setting. Alternatively, or additionally, the method 200 may involve providing haptic feedback when a user-selected setting corresponds with a setting that a user has previously selected.

FIGS. 3A-3C show some examples of geometric shapes that may be displayed when performing the method of FIG. 2. In these examples, the geometric shape 300 is a circle. However, in other implementations the geometric shape 300 may be other shapes, such as ellipses, triangles, rectangles, pentagons, hexagons, heptagons, octagons, nonagons, etc. According to some examples, the shape may not be a geometric shape, but may instead be an image (e.g., an image of an ear, a microphone, a speaker, headphones, etc.). FIG. 3A may, in some instances, be the first display that is provided on the display system 105 after the apparatus 100 or the ear device 120 receives user input indicating that a user desires to control a setting, such as a headphone transparency setting. The user input may vary according to the particular implementation. In some instances, the user input may be a touch, a gesture, a force, an acceleration, etc., that is detected by a sensor system of the apparatus 110 or the ear device 120. In other instances, the user input may be a voice command that is received by a microphone of the apparatus 110 or the ear device 120.

In this example, the size of the geometric shape 300 that is shown in FIG. 3A is a default size and corresponds to a default headphone transparency setting. According to some examples, a geometric shape 300 may first be displayed in a default size, which a user may adjust if the user so desires. Alternatively, or additionally, if a user has previously indicated a setting, such as a preferred headphone transparency setting, the geometric shape 300 may first be displayed in a size that corresponds with the preferred headphone transparency setting.

According to the example shown in FIG. 3B, the arrow 310 indicates a direction of digit motion relative to the display. According to this example, the arrow 310 indicates that a downward swipe of a digit has been detected by the sensor system 115, which may be a touch sensor system or a gesture sensor system. In response to an indication of digit motion from the sensor system, a control system of the apparatus 100 has controlled the display system 105 to present a sequence of images indicating that the geometric shape 300 contracts. Accordingly, at the time corresponding to FIG. 3B, the geometric shape 300 is being displayed in a smaller size relative to the geometric shape 300 shown in FIG. 3A. The sequence of images may include 2 or more images of the geometric shape 300. For example, the sequence of images may include at least the geometric shape 300 shown in FIG. 3A (the geometric shape 300 at the default size 305) and the geometric shape 300 shown in FIG. 3B.

In alternative implementations, the control system of the apparatus 100 may control the display system 105 to present a sequence of images indicating that the geometric shape 300 contracts in response to other types of user input, such as a swipe in a different (e.g., upwards or lateral) direction. According to some examples, the control system may control the display system 105 to present a sequence of images indicating that the geometric shape 300 expands or contracts in response to detected multi-touch input, such as a detected two-finger pinch, a detected two-finger expansion, etc.

In the example shown in FIG. 3B, the relatively smaller size of the geometric shape 300 corresponds with a different headphone transparency setting than that indicated in FIG. 3A. For example, the relatively smaller size of the geometric shape 300 may indicate that the corresponding headphone transparency setting is less transparent that that indicated by the size of the geometric shape 300 in FIG. 3A. A "less transparent" setting may be a setting in which environmental sounds are relatively less apparent to a person wearing the headphones. In some examples, the smallest size of the geometric shape 300 may correspond with a minimum external microphone signal gain setting. According to some such examples, the smallest size of the geometric shape 300 may correspond with a minimum external microphone signal gain setting and an automatic noise cancellation setting in which automatic noise cancellation is enabled.

In FIG. 3C, the geometric shape 300 is being displayed in a relatively larger size than that indicated in FIG. 3A or FIG. 3B. In this example, the relatively larger size of the geometric shape 300 corresponds with a different headphone transparency setting. For example, the relatively larger size of the geometric shape 300 may indicate that the corresponding headphone transparency setting is more transparent that those indicated by the sizes of the geometric shapes 300 in FIGS. 3A and 3B. A "more transparent" setting may be a setting in which environmental sounds are relatively more apparent to a person wearing the headphones. In some examples, the largest size of the geometric shape 300 may correspond with a maximum external microphone signal gain setting. According to some such examples, the largest size of the geometric shape 300 may correspond with a maximum external microphone signal gain setting and an automatic noise cancellation setting in which automatic noise cancellation is not enabled. In some such examples, other transparency settings also may correspond to an automatic noise cancellation setting in which automatic noise cancellation is not enabled.

FIGS. 3D-3F show some alternative examples of geometric shapes that may be displayed when performing the method of FIG. 2. In these examples, the geometric shape 300 is a rectangle. More specifically, the geometric shape 300 is a square in these examples. In some implementations, the size of the geometric shape 300 that is shown in FIG. 3A is a default size and corresponds to a default headphone transparency setting. In some alternative examples, the size of the geometric shape 300 that is shown in FIG. 3D may correspond to a preferred setting, such as a preferred headphone transparency setting, that has previously been selected.

According to the example shown in FIG. 3E, the arrow 310 indicates a direction of digit motion relative to the display. According to this example, the arrow 310 indicates that a downward swipe of a digit has been detected by the sensor system 115. In response to an indication of digit motion from the sensor system, a control system of the apparatus 100 has controlled the display system 105 to present a sequence of images indicating that the geometric shape 300 contracts. Accordingly, at the time corresponding to FIG. 3E, the geometric shape 300 is being displayed in a smaller size relative to the geometric shape 300 shown in FIG. 3D. In alternative implementations, the control system of the apparatus 100 may control the display system 105 to present a sequence of images indicating that the geometric shape 300 contracts in response to other types of user input.

In the example shown in FIG. 3E, the relatively smaller size of the geometric shape 300 corresponds with a different headphone transparency setting than that indicated in FIG. 3E, which may be a relatively less transparent headphone transparency setting.

In FIG. 3F, the geometric shape 300 is being displayed in a relatively larger size than that indicated in FIG. 3A or FIG. 3B. The relatively larger size of the geometric shape 300 corresponds with a different headphone transparency setting, e.g., a more transparent headphone transparency setting than those indicated by the size of the geometric shapes 300 in FIGS. 3A and 3B.

Figure 4B:
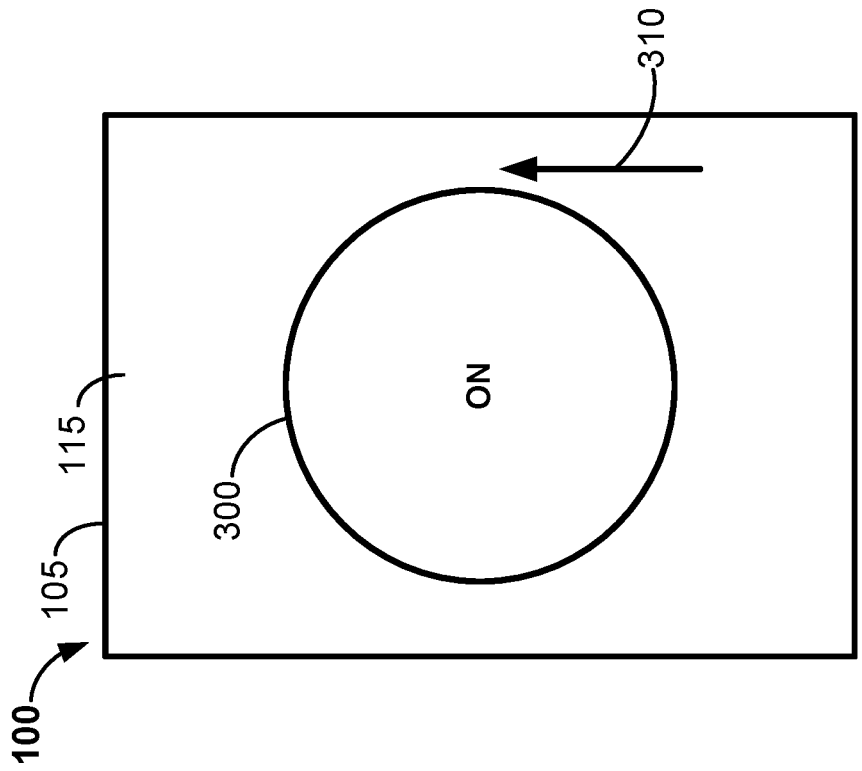
FIGS. 4A and 4B are examples of geometric shapes that may be displayed when performing a disclosed method.
Figure 4A:
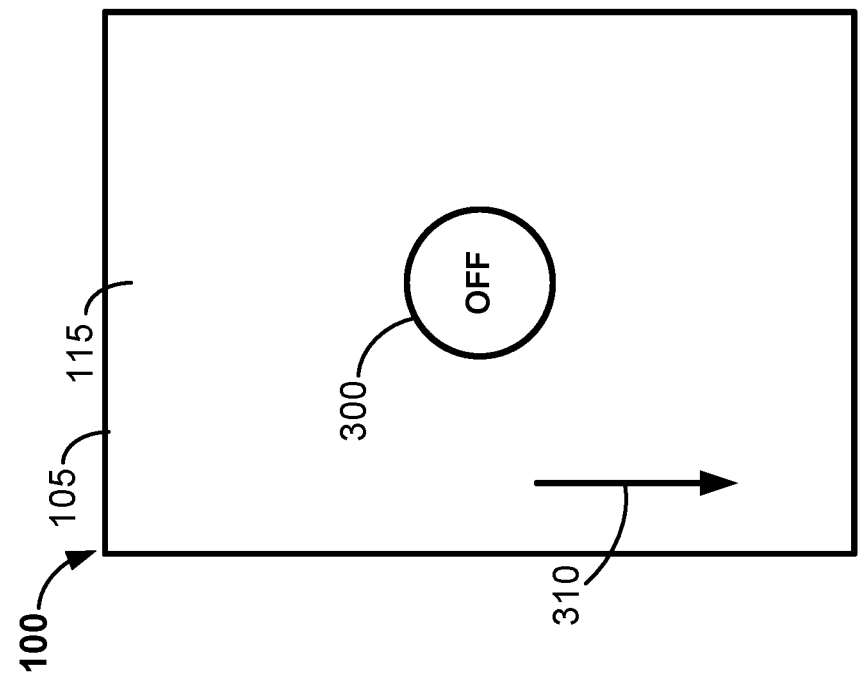

FIGS. 4A and 4B are examples of geometric shapes that may be displayed when performing a disclosed method. In this example, the method involves controlling a noise reduction process. In some examples, the noise reduction process may be implemented via an ANC system of an ear device 120. The method may or may not involve controlling a transparency setting of an ear device 120, depending on the particular implementation. In other examples, the noise reduction process may be implemented as part of an audio recording process. In some such examples, the noise reduction process may involve applying a filter, such as a low-pass filter, a high-pass filter, a notch filter, etc.

Either FIG. 4A or FIG. 4B may be the first display that is provided on the display system 105 after the apparatus 100 or the ear device 120 receives user input indicating that a user desires to control an ANC setting. The user input may be a touch, a gesture, a force, an acceleration, a voice command, etc., and may vary according to the particular implementation.

If, for example, the noise reduction process will be implemented via an ANC system of an ear device 120, whether FIG. 4A or FIG. 4B will be the first display that is provided on the display system 105 will depend on whether the ANC system is currently on or off.

According to the examples shown in FIG. 4A and FIG. 4B, the arrow 310 indicates a direction of digit motion relative to the display. According to the example shown in FIG. 4A, the arrow 310 indicates that a downward swipe of a digit has been detected by the sensor system 115, which may be a touch sensor system or a gesture sensor system. In response to the indication of digit motion from the sensor system, a control system of the apparatus 100 has controlled the display system 105 to present a relatively smaller size of the geometric shape 300, indicating that the noise reduction process is, or will be, switched off. In the example shown in FIG. 4B, the arrow 310 indicates that an upward swipe of a digit has been detected by the sensor system 115. In response to the indication of digit motion from the sensor system, a control system of the apparatus 100 has controlled the display system 105 to present a relatively larger size of the geometric shape 300, indicating that the noise reduction process is, or will be, switched on.

Figure 5:
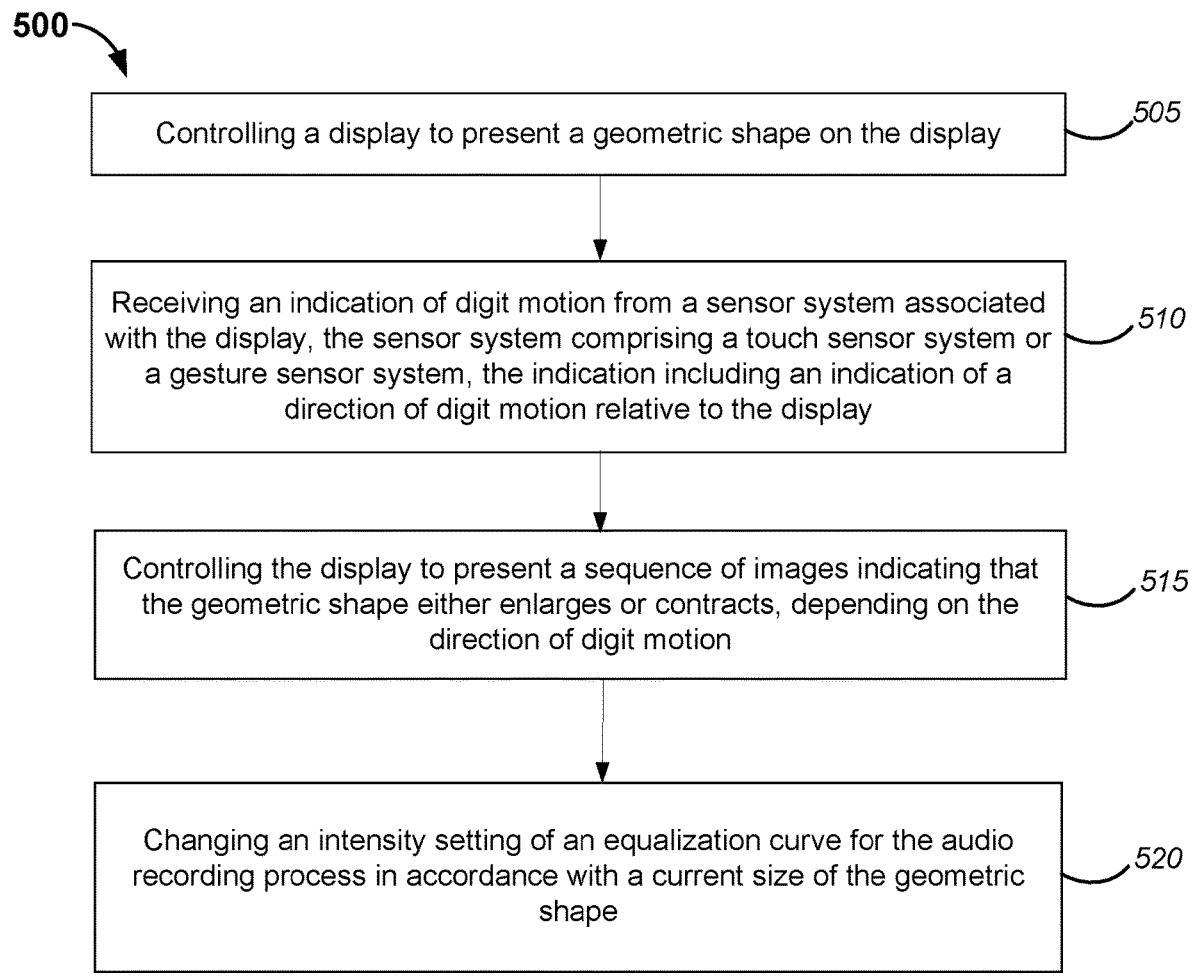
FIG. 5 is a flow diagram that outlines another example of a method that may be performed by an apparatus such as that shown in FIG. 1.

FIG. 5 is a flow diagram that outlines another example of a method that may be performed by an apparatus such as that shown in FIG. 1. The blocks of method 500, like other methods described herein, are not necessarily performed in the order indicated. Moreover, such methods may include more or fewer blocks than shown and/or described.

In this example, method 500 involves controlling one or more settings of an audio recording process. According to this implementation, block 505 involves controlling a display to present a geometric shape on the display. Block 505 may, for example, involve the control system 110 of FIG. 1 controlling a display of the display system 105. In some examples, the geometric shape may be a circle. However, in some implementations the geometric shape may be a rectangle or another geometric shape. In some examples, block 505 may involve controlling the display to present an image. The image may, for example, correspond to a musical instrument, musical notation, a recording device, a loudspeaker, etc.

According to this example, block 510 involves receiving an indication of digit motion from a sensor system associated with the display. Block 510 may involve the control system 110 of FIG. 1 receiving the indication from a touch sensor system or a gesture sensor system of the sensor system 105. In this example, the indication includes an indication of a direction of digit motion relative to the display, which may be an indication of an upward, downward, left, right, diagonal, or other direction of digit motion relative to the display.

In this implementation, block 515 involves controlling the display to present a sequence of images indicating that the geometric shape either enlarges or contracts, depending on the direction of digit motion. The sequence of images may include 2 or more images of the geometric shape. In some such examples, block 515 may involve indicating that the geometric shape enlarges in response to a predetermined direction of digit motion, such as an upwards or a downwards digit motion.

According to this example, block 520 involves changing an intensity setting of an equalization curve for the audio recording process according to a current size of the geometric shape. In some examples, the current size of the geometric shape may correspond to a gain setting for a range of frequencies. In some instances, the intensity setting may correspond with a shape of the equalization curve. The equalization curve may, for example, be a selectable pre-set equalization curve.

Figure 6:
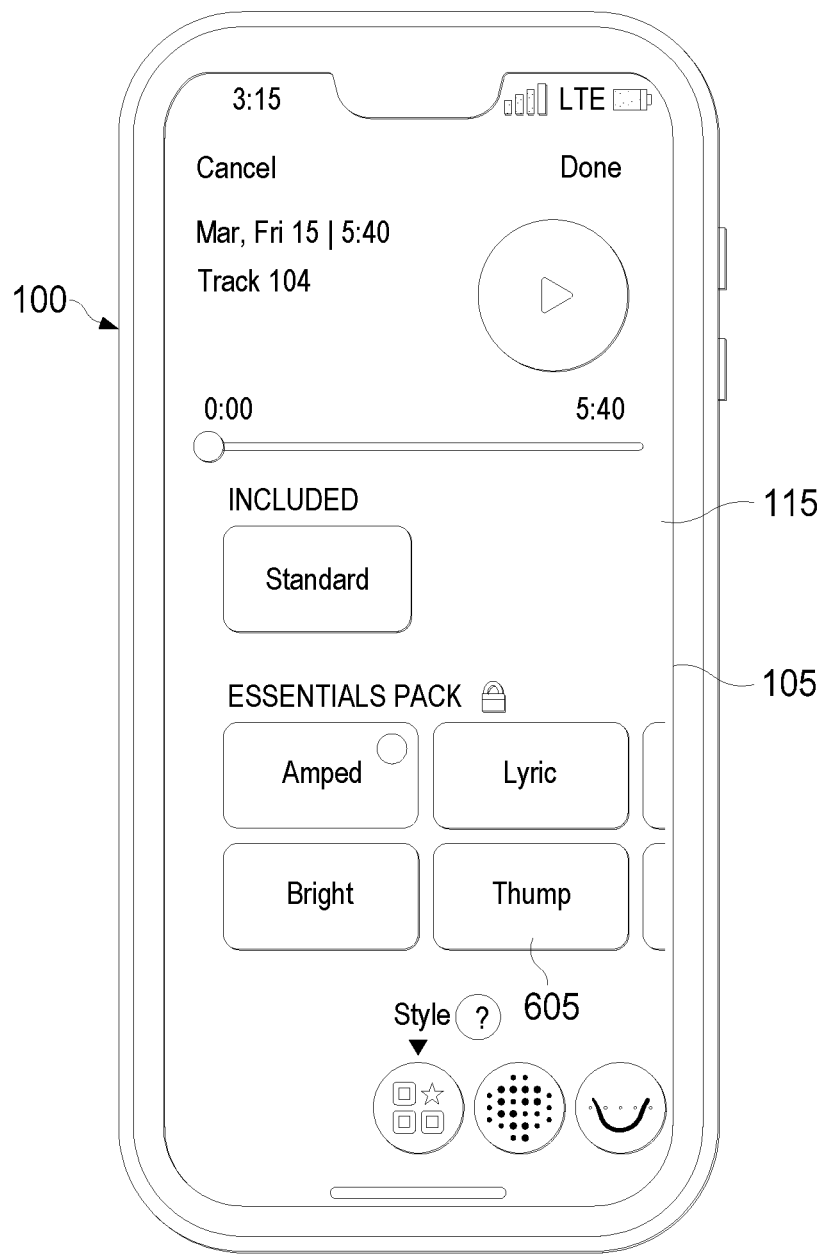
FIG. 6 shows an example of a display presenting a plurality of icons, each icon corresponding to a different pre-set equalization curve.

FIG. 6 shows an example of a display presenting a plurality of icons, each icon corresponding to a different pre-set equalization curve. In this example, the apparatus 100 is a cellular telephone. In this example, a control system of the apparatus 100 is controlling the display system 105 to display a plurality of icons 605. Each of the icons 605 corresponds to a different pre-set equalization curve that a user may select for audio recording by touching the corresponding area of the sensor system 115. Accordingly, in some examples method 500 may involve receiving, from the sensor system 115, an indication of a touch in an area of the display corresponding with an icon 605. Method 500 may involve selecting a pre-set equalization curve corresponding to the icon. The pre-set equalization curve may be used for audio recording.

Figure 7:
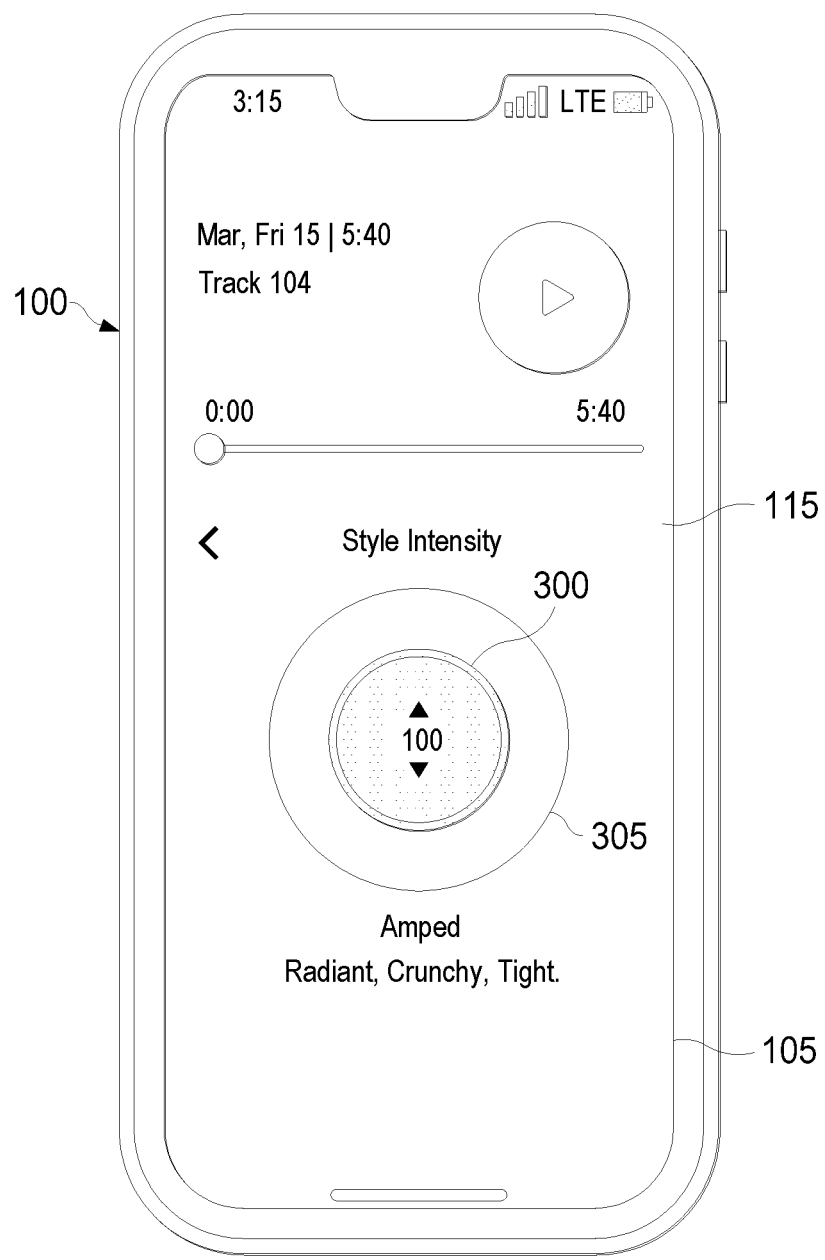
FIG. 7 shows an example of a display that may be presented after one of the icons shown in FIG. 6 has been selected.

FIG. 7 shows an example of a display that may be presented after one of the icons shown in FIG. 6 has been selected. According to this example, the user has selected the icon 605 labeled "Amped" by touching the corresponding area of the sensor system 115. Accordingly, the apparatus 100 will invoke a pre-set equalization curve corresponding to the "Amped" icon for audio recording. However, in the example shown in FIG. 7, the apparatus 100 is controlling the display system 105 to provide a GUI that allows a user to change an intensity setting of the equalization curve according to a current size of the geometric shape 300 according to an indication of a direction of digit motion that is detected by the sensor system 115. The apparatus 100 may be configured for controlling the display system 105 to present a sequence of images indicating that the geometric shape 300 either enlarges or contracts, depending on a detected direction of digit motion. According to some examples, a control system of the apparatus 100 will cause the display system 105 to indicate that the geometric shape 300 enlarges in response to a detected upward digit motion. However, in some examples the geometric shape 300 may enlarge or contract according to other detected digit motions, e.g., the geometric shape 300 may contract in response to a detected upward digit motion.

In some examples, the current size of the geometric shape 300 may correspond to a gain setting for a range of frequencies. In some instances, the intensity setting may correspond with a shape of the equalization curve. In this example, the default size 305 of the geometric shape 300 corresponds to a default intensity setting.

Figure 8A:
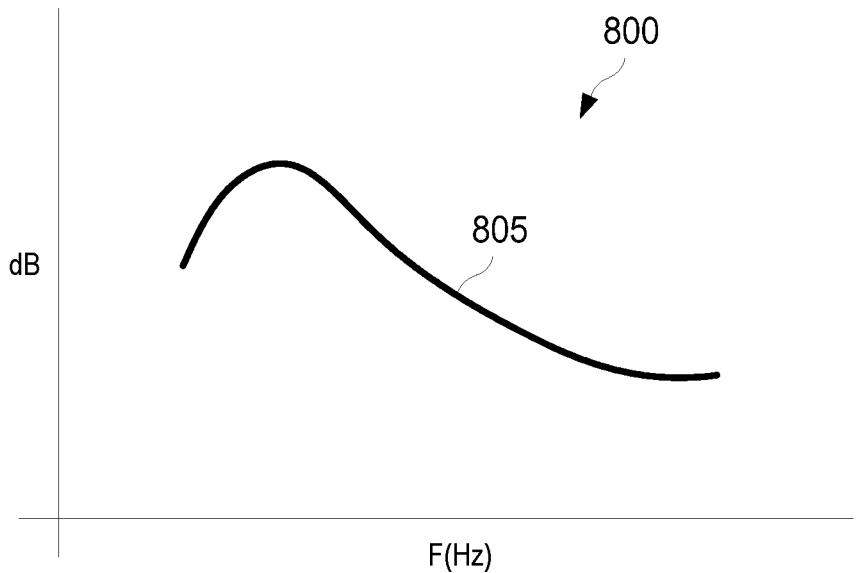
FIG. 8A shows an example of an equalization curve with a default intensity setting.

FIG. 8A shows an example of an equalization curve with a default intensity setting. The default intensity setting may, for example, correspond to a pre-set equalization curve that is represented by one of the icons shown in FIG. 6. In this example, the graph 800 indicates decibels on the vertical axis and frequencies on the horizontal axis. The range of frequencies over which the equalization curve 805 extends may, for example, include the range of audible frequencies for humans, e.g., 20 Hz to 20,000 Hz.

Figure 8B:
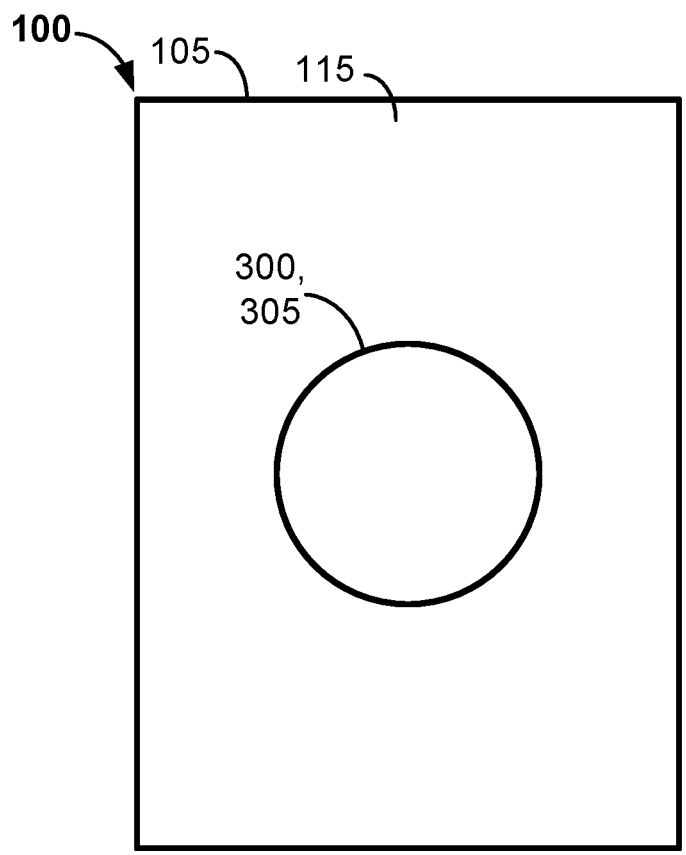
FIG. 8B shows an example of a display presenting a geometric shape that corresponds with the equalization curve of FIG. 8A.

FIG. 8B shows an example of a display presenting a geometric shape that corresponds with the equalization curve of FIG. 8A. In this example, the default size 305 of the geometric shape 300 corresponds to a default intensity setting.

Figure 9A:
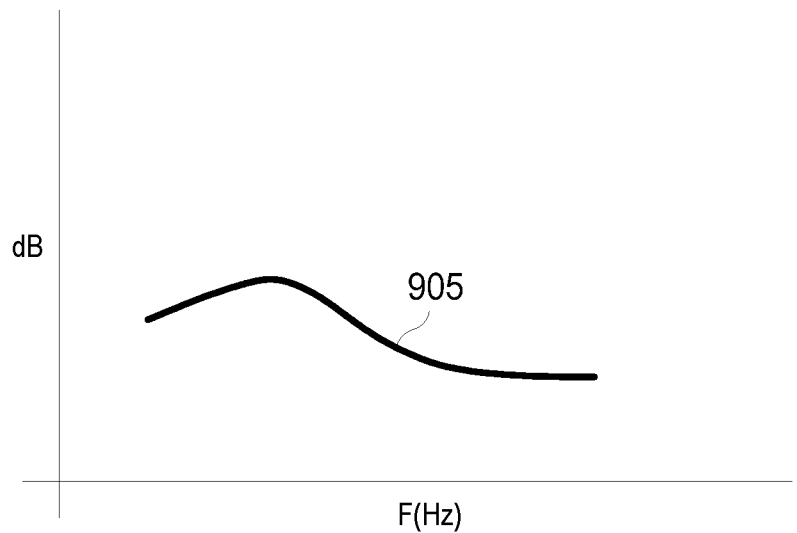
FIG. 9A shows an example of an equalization curve with a user-selected intensity setting.
Figure 9B:
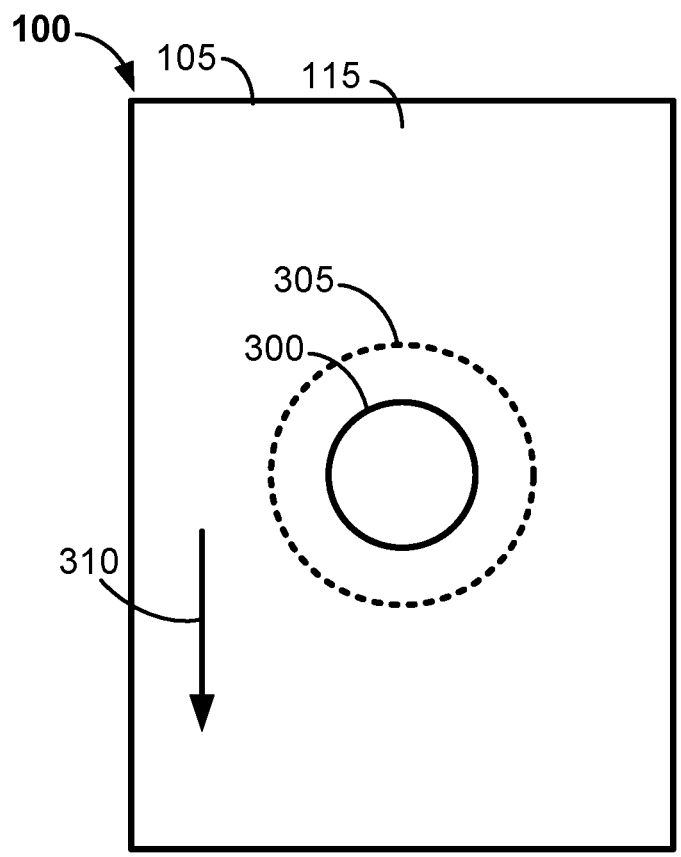
FIG. 9B shows an example of a display presenting a geometric shape that corresponds with the equalization curve of FIG. 9A.

FIG. 9A shows an example of an equalization curve with a user-selected intensity setting. FIG. 9B shows an example of a display presenting a geometric shape that corresponds with the equalization curve of FIG. 9A. According to the example shown in FIG. 9B, the arrow 310 indicates a direction of detected digit motion relative to the display system 105. According to this example, the arrow 310 indicates that a downward swipe of a digit has been detected by the sensor system 115. In response to an indication of digit motion from the sensor system, a control system of the apparatus 100 has controlled the display system 105 to present a sequence of images indicating that the geometric shape 300 contracts, relative to the size of the geometric shape 300 and the default size 305 of FIG. 8B. In this example, the smaller size of the geometric shape 300 corresponds to a relatively lower intensity for the equalization curve 905, as compared to the intensity of the equalization curve 805.

Figure 10A:
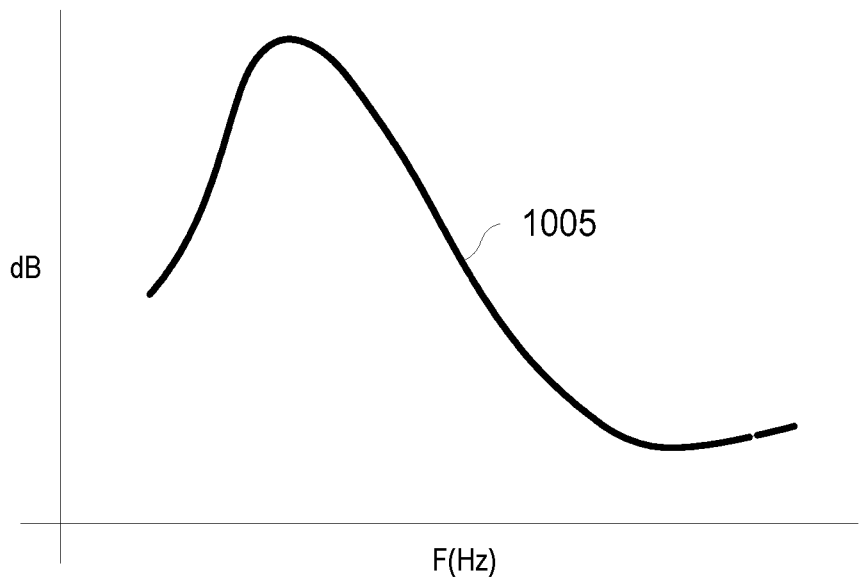
FIG. 10A shows another example of an equalization curve with a user-selected intensity setting.
Figure 10B:
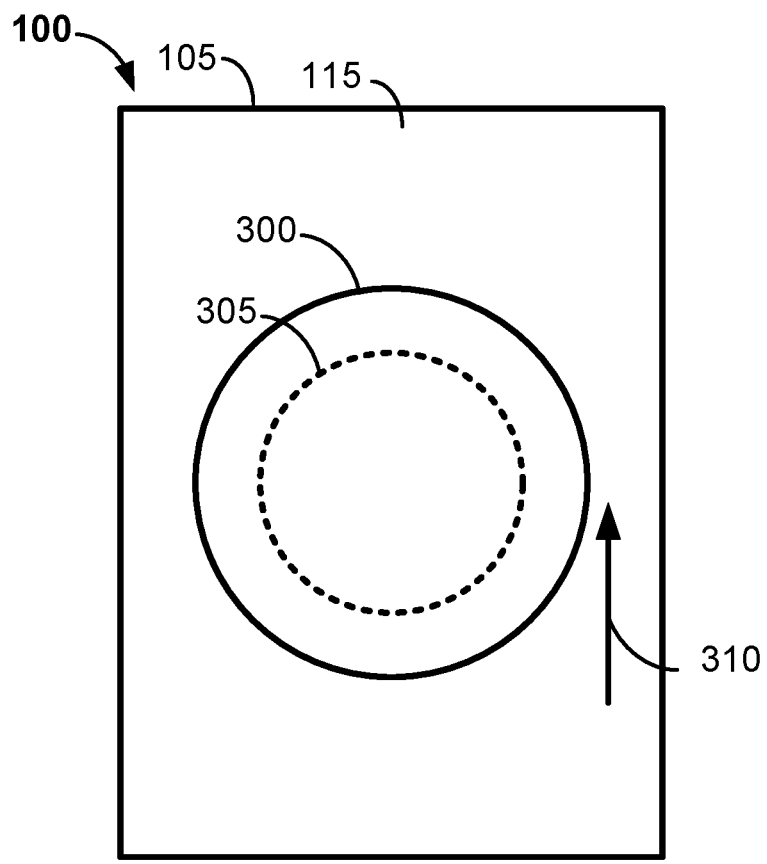
FIG. 10B shows an example of a display presenting a geometric shape that corresponds with the equalization curve of FIG. 10A.

FIG. 10A shows another example of an equalization curve with a user-selected intensity setting. FIG. 10B shows an example of a display presenting a geometric shape that corresponds with the equalization curve of FIG. 10A. According to the example shown in FIG. 10B, the arrow 310 indicates a direction of detected digit motion relative to the display system 105. According to this example, the arrow 310 indicates that an upward swipe of a digit has been detected by the sensor system 115. In response to the indication of digit motion from the sensor system 115, a control system of the apparatus 100 has controlled the display system 105 to present a sequence of images indicating that the geometric shape 300 expands, relative to the size of the geometric shape 300 of FIG. 8B or 9B. In this example, the size of the geometric shape 300 is larger than that of the default size 305. Accordingly, the larger size of the geometric shape 300 corresponds to a relatively higher intensity for the equalization curve 1005, as compared to the default intensity setting of the equalization curve 805.

According to some examples, the method 500 may involve providing some type of haptic feedback. In some such examples, the apparatus 100 and/or the ear device 120 may include apparatus for providing haptic feedback, such as one or more motors, vibrators, etc. In some instances, the method 500 may involve providing haptic feedback when a user-selected setting (e.g., a setting that corresponds with a current size of the geometric shape 300, in response to a detected motion of the user's digit on a display of the apparatus 100) corresponds with a default setting, a minimum setting and/or a maximum setting. For example, the apparatus may provide haptic feedback to a user's digit when a detected direction of digit motion causes the geometric shape 300 to be within a predetermined range (e.g., a predetermined number of pixels) of the default size 305. Alternatively, or additionally, the method 500 may involve providing haptic feedback when a user-selected setting corresponds with a setting that a user has previously selected.

Various modifications to the implementations described in this disclosure may be readily apparent to those having ordinary skill in the art. The general principles defined herein may be applied to other implementations without departing from the scope of this disclosure. Thus, the claims are not intended to be limited to the implementations shown herein, but are to be accorded the widest scope consistent with this disclosure, the principles and the novel features disclosed herein.

The invention claimed is:

1. A method of controlling headphones having external microphone signal pass-through functionality, the method comprising:
controlling a display to present a geometric shape on the display;
receiving an indication of digit motion from a sensor system associated with the display, the sensor system comprising a touch sensor system or a gesture sensor system, the indication including an indication of a direction of digit motion relative to the display;

controlling the display to present a sequence of images indicating that the geometric shape either enlarges or contracts, depending on the direction of digit motion; and changing a headphone transparency setting according to a current size of the geometric shape, wherein the headphone transparency setting corresponds to both an external microphone signal gain setting and a media signal gain setting, wherein the current size of the geometric shape also corresponds to an automatic noise cancellation setting and wherein a smallest size of the geometric shape corresponds with a headphone transparency setting having a smallest external microphone signal gain setting and an automatic noise cancellation setting in which automatic noise cancellation is enabled.

2. The method of claim 1, wherein a largest size of the geometric shape corresponds with a headphone transparency setting having a largest external microphone signal gain setting and an automatic noise cancellation setting in which automatic noise cancellation is not enabled.

3. The method of claim 1, wherein the method comprises controlling the display to present a sequence of images indicating that the geometric shape enlarges when the direction of digit motion is towards an upper portion of the display.

4. The method of claim 1, wherein the geometric shape comprises a circle.

5. The method of claim 1, wherein changing a headphone transparency setting comprises making a smooth transition between a first headphone transparency setting and a second headphone transparency setting by changing the external microphone signal gain setting and the media signal gain setting of the headphones from the first headphone transparency setting to the second headphone transparency setting over a predetermined time interval.

6. One or more non-transitory media having software stored thereon, the software including instructions for controlling one or more devices to perform the method of claim 1.

7. An apparatus, comprising:
a display;
a sensor system associated with the display, the sensor system comprising a touch sensor system or a gesture sensor system; and
a control system comprising one or more processors, the control system being configured to perform the method of claim 1.

8. A method of controlling headphones having external microphone signal pass-through functionality, the method comprising:
controlling a display to present a geometric shape on the display;
receiving an indication of digit motion from a sensor system associated with the display, the sensor system comprising a touch sensor system or a gesture sensor system, the indication including an indication of a direction of digit motion relative to the display;
controlling the display to present a sequence of images indicating that the geometric shape either enlarges or contracts, depending on the direction of digit motion; and
changing a headphone transparency setting according to a current size of the geometric shape, wherein the headphone transparency setting corresponds to both an external microphone signal gain setting and a media signal gain setting, wherein the current size of the geometric shape also corresponds to an automatic noise cancellation setting and wherein a largest size of the geometric shape corresponds with a headphone transparency setting having a largest external microphone signal gain setting and an automatic noise cancellation setting in which automatic noise cancellation is not enabled.

9. The method of claim 8, wherein a smallest size of the geometric shape corresponds with a headphone transparency setting having a smallest external microphone signal gain setting and an automatic noise cancellation setting in which automatic noise cancellation is enabled.

10. The method of claim 8, wherein the method comprises controlling the display to present a sequence of images indicating that the geometric shape enlarges when the direction of digit motion is towards an upper portion of the display.

11. The method of claim 8, wherein the geometric shape comprises a circle.

12. The method of claim 8, wherein changing a headphone transparency setting comprises making a smooth transition between a first headphone transparency setting and a second headphone transparency setting by changing the external microphone signal gain setting and the media signal gain setting of the headphones from the first headphone transparency setting to the second headphone transparency setting over a predetermined time interval.

* * * * *